United States Patent
Kazinczi

(10) Patent No.: US 7,965,547 B2
(45) Date of Patent: *Jun. 21, 2011

(54) ARRANGEMENT AND METHOD FOR CONTROLLING A MICROMECHANICAL ELEMENT

(75) Inventor: Robert Kazinczi, Helmond (NL)

(73) Assignee: Cavendish Kinetics, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/576,267

(22) Filed: Oct. 9, 2009

(65) Prior Publication Data

US 2010/0080052 A1    Apr. 1, 2010

Related U.S. Application Data

(62) Division of application No. 11/579,239, filed as application No. PCT/EP2005/005484 on May 20, 2005, now Pat. No. 7,613,039.

(30) Foreign Application Priority Data

Jun. 15, 2004    (GB) .................................. 0413341.9

(51) Int. Cl.
    *G11C 11/50* (2006.01)
(52) U.S. Cl. ......................................... 365/164; 200/181
(58) Field of Classification Search .................. 200/181; 361/233; 365/164
    See application file for complete search history.

(56) References Cited

U.S. PATENT DOCUMENTS

| 4,674,180 | A | 6/1987 | Zavracky et al. |
|---|---|---|---|
| 5,677,823 | A | 10/1997 | Smith |
| 6,115,231 | A | 9/2000 | Shirakawa |
| 6,229,683 | B1 | 5/2001 | Goodwin-Johansson |
| 6,473,361 | B1 | 10/2002 | Chen et al. |
| 6,509,605 | B1 | 1/2003 | Smith |
| 6,531,668 | B1 * | 3/2003 | Ma .................................. 200/181 |
| 6,646,215 | B1 | 11/2003 | Nelson |
| 6,744,338 | B2 * | 6/2004 | Nikitin ........................... 333/262 |
| 7,027,282 | B2 * | 4/2006 | Ryhanen et al. ............... 361/139 |
| 7,613,039 | B2 * | 11/2009 | Kazinczi ........................ 365/164 |
| 2002/0075094 | A1 | 6/2002 | Bechtle et al. |
| 2002/0097136 | A1 | 7/2002 | Coleman et al. |

FOREIGN PATENT DOCUMENTS

EP    1227496 A1    7/2002

(Continued)

OTHER PUBLICATIONS

Office Action for European Patent Application No. 05748344.8-2203 (CK006EP) dated Mar. 3, 2010.

(Continued)

*Primary Examiner* — Alexander Sofocleous
(74) *Attorney, Agent, or Firm* — Patterson & Sheridan, LLP

(57) ABSTRACT

The invention concerns an arrangement for controlling a non-volatile memory arrangement for a circuit comprising: a micromechanical element coupled to a substrate; the micromechanical element being responsive to deflection means arranged on the substrate to control the movement of the micromechanical element between one or more stable states. In addition, the invention concerns a method for controlling a non-volatile memory device arrangement comprising: applying one or more signals to a deflection means for moving a micromechanical element between one or more stable states. To enhance the efficacy of the invention there is further provided a shorting circuit for use in the non-volatile memory arrangement.

20 Claims, 3 Drawing Sheets

FOREIGN PATENT DOCUMENTS

WO     WO-99/63559 A1     12/1999

OTHER PUBLICATIONS

European Search Report for Application 10160530.1-2209 (CK006EPD1) dated Jun. 28, 2010.

PCT International Preliminary Report PCT/EP2005/005484 dated Dec. 20, 2006 (CK006PCT).

Notification of the First Office Action dated Nov. 14, 2008 for Chinese Patent Application No. 200580017698.7. (CK006CN).

Notification of the Second Office Action for Chinese Patent Application No. 200580017698.7 dated May 8, 2009.

International Search Report; PCT/GB99/01740; Nov. 11, 1999.

Lei L Mercado et al., "A mechanical approach to overcome RF MEMS switch stiction problem", 2003 Proceedings 53rd. Electronic Components and Technology Conference (ECTC) New Orleans, LA, May 27-30, 2003, pp. 377-384, XP010648345, New York, NY, IEEE, US ISBN: 0-7803-7991-5 Sections "Determine the Stiction Force" and "Conclusions" from p. 380, left col.-p. 383, left column.

Office Action for Japanese Patent Application No. 2007-515803 (CK006JP) dated Sep. 14, 2010.

\* cited by examiner

ARRANGEMENT AND METHOD FOR CONTROLLING A MICROMECHANICAL ELEMENT

This application is a divisional of co-pending U.S. patent application Ser. No. 11/579,239, filed Oct. 31, 2006, now U.S. Pat. No. 7,613,039 which was the National Stage of International Application No. PCT/EP05/05484 filed May 20, 2005. Each of the aforementioned related patent applications is herein incorporated by reference.

The present invention relates to an arrangement and method for controlling micromechanical elements, for use in a circuit, in particular, but not exclusively, in nonvolatile memory devices.

Because of this drive to minaturise devices in highly integrated circuits for microelectronics applications, there exists a tremendous potential for the use of micromechanical structures or elements in applications such as switches, capacitors and relays in the microelectronics industry. Micromechanical elements such as cantilevers, for use in memory devices, are the primary contenders for solid state memory arrays found in semiconductor chips.

In addition, micromechanical structures are being adopted for a variety of applications including micro-switches, capacitance circuits, accelerometers and optical elements. Owing to the progressive advances in fabrication techniques, micromechanical structures have been significantly reduced in size which has consequently raised their potential as logic elements or memory elements to compete with semiconductor processor and memory chips.

Conventional semiconductor non-volatile memories can be written to and erased by use of transistors having a floating gate and a control gate separated by an insulator. Charge stored on the floating gate may represent a binary value, which is determined by whether or not a predetermined voltage known as the threshold voltage has been exceeded at which time the device is switched ON.

A conventional solid state memory has storage cells which can assume either an ON state or an OFF state to represent information storage states. Charge transfer within the memory transistor defines one bit of information during the ON and OFF states, which is determined by the aforementioned threshold voltages applied to the memory transistors.

The value of micromechanical elements predominates in their small size and their potential for use, for example, as micromechanical structures that provide a medium for charge transfer for use in memory applications. It is desirable to provide a micromechanical element having good structural integrity and is reliable in switching operations. The micromechanical element is typically housed in a low pressure elongate cavity wherein it is movable and can be switched ON and OFF by the application of an actuating voltage which brings the element into and out of contact respectively with a contiguous electrode(s). This arrangement is generally known as a cell.

One of the key problems facing the performance of micromechanical contact switches/cells is that in an ON state an electrode and a micro-electromechanical element tend to stick to each other upon contact, making it difficult to separate them so as to switch the cell off, for example. The skilled addressee in the micro-electromechanical systems (MEMS) field refers to this phenomenon as "stiction", which is caused by the attraction between atoms and molecules of the two different surfaces. Where the deflection is electrostatic, high control voltages, typically as high as 40V compared with integrated circuits operating at voltages of about 5V or 3.3V, are required to induce a restoring force.

The non-volatile memory arrangement of the present invention exploits stiction between the cantilever switch and the electrode to keep the switch in the ON state. Cantilever-based relays, for example, are usually actuated to an ON state by maintaining a constant biasing voltage. However in order to relieve the micromechanical structure quickly from the ON state to an OFF state, most solutions invoke the OFF state by reducing the constant bias with the application of a negative pulse. Consequently to achieve the OFF state, a lower voltage is applied than that required to actuate the ON state.

Although stiction is a significant problem in the MEMS field, research efforts are continuing in order to circumvent it in applications such as switches and memories. In the present invention, however, stiction is exploited to maintain adhesion between the micromechanical element and the contact electrode during the switching operation in order to program the structure. The present invention seeks to induce a greater controllable restoring force in a micromechanical element so as to program and deprogram it repeatedly, quickly and proficiently.

The restoring force of a micro-electromechanical switch may be modified, for example, by the use of multiple control electrodes to pull it into contact with an electrode, or alternatively by implementing a specially shaped structural element to induce a stronger restoring force. But having more than one driving electrode increases the cost and complexity of the system employing such a switch.

In other solutions electrodes are disposed on each side of the movable micromechanical element as a means of effecting the switching operation. However, this solution has a number of limitations such as higher applied voltages, a larger cavity to house the electromechanical element, and where electrodes are disposed on each side of the structure necessitates the use of additional masks during the fabrication thereof and consequently increasing costs.

Therefore, the object of the present invention is to provide a memory element disposed with an arrangement of electrodes, which permits rapid switching operation, a greater controllable restoring force in a micromechanical element so as to program and deprogram it repeatedly, quickly and proficiently, low switching voltages, and a low mask implementation in the fabrication steps of the structure to permit a smaller cavity to house the element coupled with a cost effective fabrication.

Therefore, according to the first aspect of the present invention there is provided a non-volatile memory arrangement for a circuit comprising: a micromechanical element coupled to a substrate; the micromechanical element being responsive to deflection means arranged on the substrate to control the movement of the micromechanical element between one or more stable states.

Preferably, the or each stable states may comprise the micromechanical element having a contact state, a metastable state for inducing the controlled release of the micromechanical element from a contact state and a state in which the micromechanical element has a free end.

Most preferably, the micromechanical element may be coupled to the substrate to provide electrical contact with the substrate.

Advantageously, the deflection means may be operable to deflect the element in a direction away from a contact position in a rapid release mode and it is the deflection means that induces the or each stable state.

Preferably, the deflection means comprises one or more coplanar electrodes.

Preferably, the micromechanical element may be resiliently deformable in response to the deflection means and is made from a conducting material advantageously selected from a group of materials belonging to Titanium, Tungsten, Aluminum, Copper or Tantalum.

Preferably, a first voltage may be applied to the deflection means to pull-in the micromechanical element so as to bring it into contact with a first electrode, and a second voltage is applied to the deflection means so as to bring the micromechanical element in proximity with the deflection means.

Preferably, micromechanical element may comprise having different physical characteristics, more specifically it comprises portions having a higher bending stiffness from a next portion.

In a further aspect of the present invention there is provided a method for controlling a nonvolatile memory device arrangement comprising: applying one or more signals to a deflection means for moving a micromechanical element between one or more stable states.

Preferably, the step of applying the one or more control signals to the deflection means may move the micromechanical element into a contact state. Preferably, the steps of the method may include generating a predetermined signal for inducing the deflection of the micromechanical element in a direction away from a contact position in a rapid release mode.

Advantageously, the step of generating the one or more predetermined signals to the deflection means may move the micromechanical element in proximity to the deflection means.

In yet a further aspect of the present invention there is provided, a shorting circuit comprising: a first micromechanical element proximal to a second micromechanical element each being responsive to respective first and second deflection means for moving the respective micromechanical elements; current limiting means, a grounding conductor associated with the deflection means and current limiting means; wherein the first deflection means is engageable with the second deflection means to effect shorting.

Advantageously, the first micromechanical element may be arranged substantially perpendicular to the second micromechanical element, and the current limiting means within the circuit is a resistor.

Preferably, the respective deflection means may comprise one or more electrodes to pull-in or pull-off the micromechanical element from a contact electrode. Advantageously, the pull-in electrode of the first micromechanical element is engagable with the contact electrode of the second micromechanical element to effect shorting of the first micromechanical element.

Preferably the shorting circuit may be operable in the non-volatile memory device of the present invention.

The present invention is particularly advantageous compared with known solution in that the pull-in and pull-off electrodes are in the same plane. This has the implication that no extra masking step and extra layer during fabrication thereof are required for the de-programming of the switch. In addition to this, the electrostatic gap is also smaller under the programmed cantilever, which could result in lower de-programming voltages than that required in a configuration where the electrodes are disposed on each side of the micromechanical element.

DETAILED DESCRIPTION OF THE INVENTION

Embodiments of the present invention will now be described, by way of example only with reference to the accompanying drawings in which.

Figure 1:
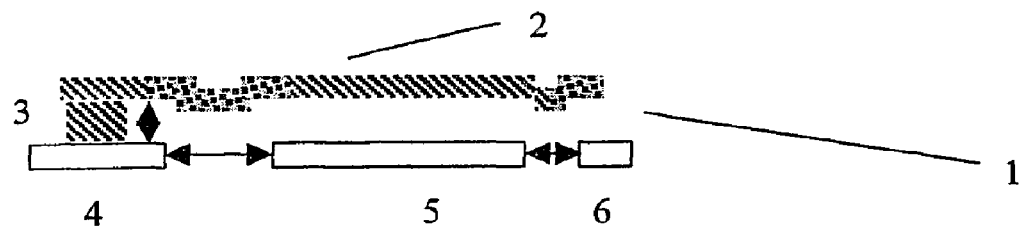
FIG. 1 shows non-volatile memory cell arrangement in which there is no application of voltage.

The present embodiment is described in terms of the different states that the memory cell, which is housed in a low pressure environment, undertakes to effect the integers of invention. FIG. 1 refers to the first state of the present embodiment of the invention wherein the non-volatile memory cell arrangement 1 comprises: a micromechanical element 2, such as a cantilever in the present embodiment; a support portion 3 of the element 2 disposed on a first electrode 4; the free end of the element 2 is moveable above the second electrode 5 and third electrode 6; with electrodes 4, 5 and 6 being disposed in a coplanar arrangement. Z denotes the separation between the lower surface of the micromechanical element 2 and the upper surface of the electrodes 4, 5 and 6. X denotes the separation between the electrodes 4 and 5, while Y denotes the separation between the electrodes 5 and 6. Electrode 5 is a switching electrode while electrode 4 and electrode 6 function as contact electrodes. In the first state, no voltages are applied to the cell. Therefore, no electrostatic forces are present between element 2 and electrodes 4, 5 and 6, and hence the cell exists in a state of equilibrium in which element 2 remains stationary.

Figure 2:
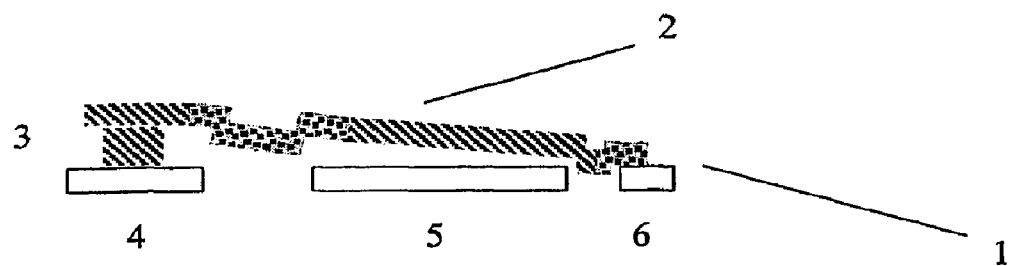
FIG. 2 shows a cross section of the non volatile memory cell arranged in a second state in which it can be activated to an ON state.

Referring to FIG. 2, element 2 of the non volatile memory cell 1 can be placed in a second state in which it can be activated to an ON state. This is achieved by the application of a biasing voltage V1, for example, at deflection electrode 5, which induces electrostatic forces between element 2 and electrode 5 urging element 2 towards contact electrode 6. When this "pull-in" voltage reaches a threshold value, the element 2 can initiate charge transfer to electrode 6 as a result of contact therebetween, which consequently renders the element 2 in a programmed state. When the biasing voltage V1 is removed at electrode 5 after programming, that is V1=0, element 2 remains in contact with electrode 6. This is known as the programmed state. Contact is retained . . . attraction such as, Van der Waals forces or surface tension collectively known as stiction or metal-to-metal bonding, which constitutes an energetically favourable adhesive state of cell 1 in this mode.

Further, in this state the micromechanical structure 2 stores elastic energy and the memory cell 1 contains an additional energy component caused by the stiction forces generated at the interface between the element's tip and the contact electrode as described hereinbefore.

It should be noted that in some applications such as volatile memories, stiction retaining contact between the contact electrode 6 and element 2 is not a desirable feature. Therefore, to counteract this, electrodes may be coated with thin films of polymer to reduce adhesion energy between element 2 and 6.

Figure 3:
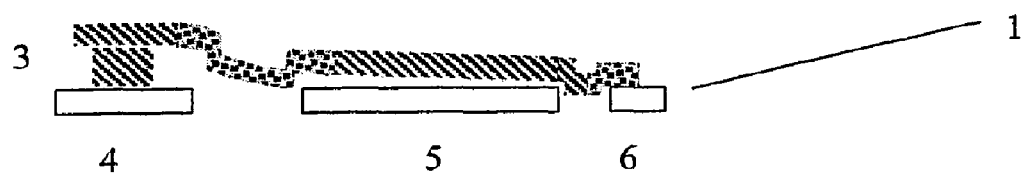
FIG. 3 shows a cross section of the non-volatile memory device shows the micromechanical element 2 still in contact at an electrode, with the additional voltage thereby pulling-in the element further towards the electrode.

The nonvolatile memory cell 1 of the present invention, undertakes another state step after the contact mode described hereinbefore. Referring to FIG. 3, a biasing voltage V2

(V2>0<0) is applied between electrode 5 and element 2 while the element 2 is still in contact at electrode 6, thereby pulling-in element 2 further towards electrode 5. As element 2 bends towards electrode 5, additional elastic strain energy is generated and stored within one or more portions of element 2. The increase in elastic energy of the micromechanical element should be sufficient to surmount the adhesive forces present at the interface between element 2 and electrode 6. It should be noted that the applied voltage should control the displacement of the element in a manner so as to prevent direct contact of the micromechanical element 2 with electrode 5 as this would short the cell.

Figure 4:
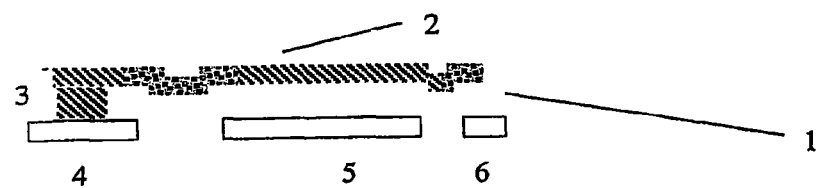
FIG. 4 shows that when the voltage at electrode 5 is dropped quickly, the micromechanical element is rapidly deflected in a direction away from the deflecting electrode.

In a further step, when voltage V2 at electrode 5 is dropped quickly (|V|→0), element 2 is rapidly deflected in a direction away from the deflecting electrode 5 as shown in FIG. 4. Elastic strain energy stored in element 2 counteracts the adhesive forces or stiction between it and contact electrode 6 thereby releasing the element 2 in a rapid release mode. The adhesive forces constitute an energy barrier at the interface between electrode 6 and element 2. In this mode the element 2 makes a transition from the energetically favourable adhesive state to a next state in which the element 2 can move freely. This is known as the de-programmed state. The program and de-program states are performed successively and repeatedly.

While the rapid release mode is an important aspect of the present invention, it is important that the application of a voltage to the deflection electrode 5 in the rapid release mode is sufficiently fast that the mechanical pulse propagation within the material should be the limiting factor, and this is related to the mechanical resonance frequency ($1^{st}$ natural mode frequency) of the micromechanical element 2. This is because the stored elastic energy may undesirably dissipate to the extent that the rapid release of the micromechanical element may not be effected. It is undesirable to slow down the motion of the micromechanical element by having an electrical pulse falling at slower rate than the mechanical resonance, which mechanical resonance includes the effects of viscous damping and clamping support loss.

Figure 5:
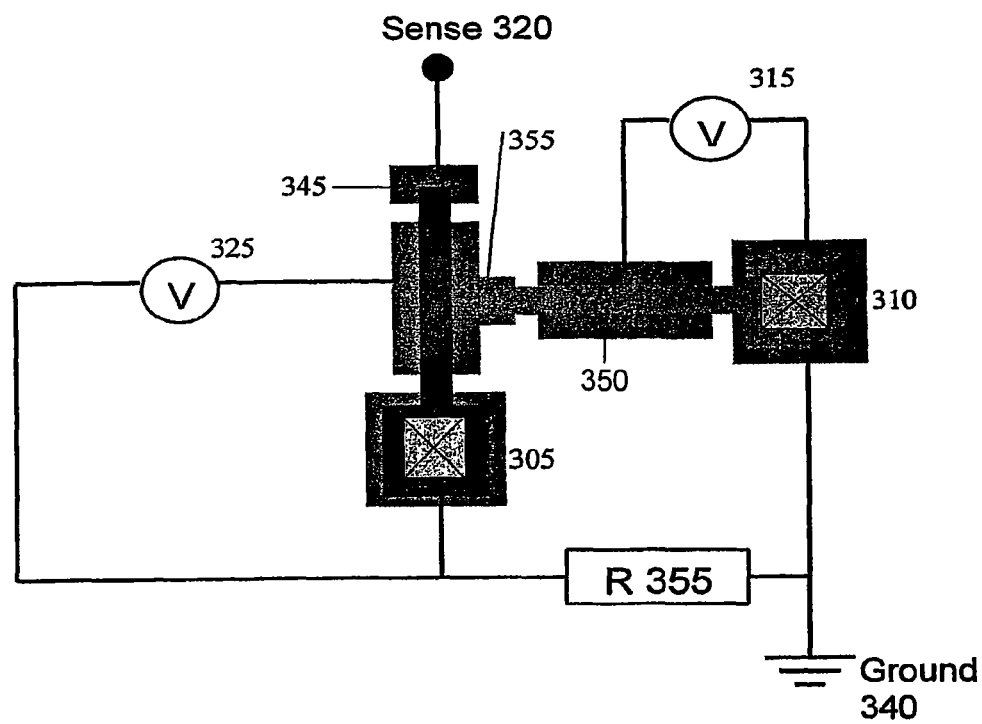
FIG. 5 shows the shorting circuit operable in the non-volatile device of the present invention.

Moreover, if such a fast pulse cannot be supplied by the driving electronics of the memory cell, the 'pull-in electrode' of one micromechanical element can be shorted by another micromechanical element. Referring to FIG. 5, in circuit 300 the micromechanical element 305 is arranged in proximity with another micromechanical element 310 grounded at 340 in circuit 300. Micromechanical element 310 has a pull-in electrode 350 and a contact electrode 355, while micromechanical element 305 has a contact electrode 345 and pull-in electrode 355 which is the contact electrode of micromechanical element 310.

In normal operation of the device, as described hereinbefore with reference to FIG. 5, as micromechanical element 305 is pulled in, by the driving/sensing circuit 320, at a deflecting voltage V1 (V>0) 325, and then pulled in further by a voltage supplied at V2 325 in the next step to increase the elastic strain energy and subsequently cause rapid release of micromechanical element 305. When micromechanical element 310 makes contact with the pull-in electrode 355 of micromechanical element 305, the pull-in electrode 355 is shorted and its voltage falls rapidly to zero owing to the large resistor 335 which limits the current at micromechanical element 310.

The rapid release mode mechanism is much more effective if the touching area between the micromechanical element and the electrode is minimized. Thus only the tip of the micromechanical element should touch the contact electrode during the de-programming cycle so as to ensure that it does not snap down into the 'flat' mode, that is, contact the pull-in electrode. This can be achieved by several methods including the provision of a stiff section proximal to the tip to prevent flat mode.

Therefore, in yet a further embodiment of the present invention, the deflection during the rapid release mode of the micromechanical element may be enhanced by providing a structure having variations in bending stiffness along its length. For example, referring back to the micromechanical cell of FIG. 1, the length 2 of the segment may be made of a material having a high bending stiffness because this segment is pulled in further during the metastable mode. The other lengths of the structure, length B and length C, may each have a predetermined bending stiffness to accommodate the higher bending stiffness in the length B, so as to maintain the structural integrity of the micromechanical element 5.

In addition to this, there are a number of ways in which the voltage pulses applied to the cell 1 of FIGS. 1-4 can be reduced in order to reduce power consumption. Referring again to FIG. 1, by reducing the displacement Z between the lower surface of micromechanical element 2 and the electrodes, a lower biasing voltage may be applied at electrode 5 to pull in the structural element 2 so as to effect electrical contact thereof with electrode 6. However, the separation Z should be such that there is no contact between the electrode 5 and the element 2, which would cause undesirable shorting of the electrode 5 and cause premature de-activation of the device.

Referring to FIGS. 1-4, the inter-electrode spacing of the cell can be altered to change the amount of elastic strain energy stored in element 2. For example, if electrode 5 is situated further from the electrode 6, the micromechanical element 2 may be pulled in further owing to the lower probability that it may come into contact with electrode 5 before rapid release. This would cause shorting of the electrode 5.

Figure 6:
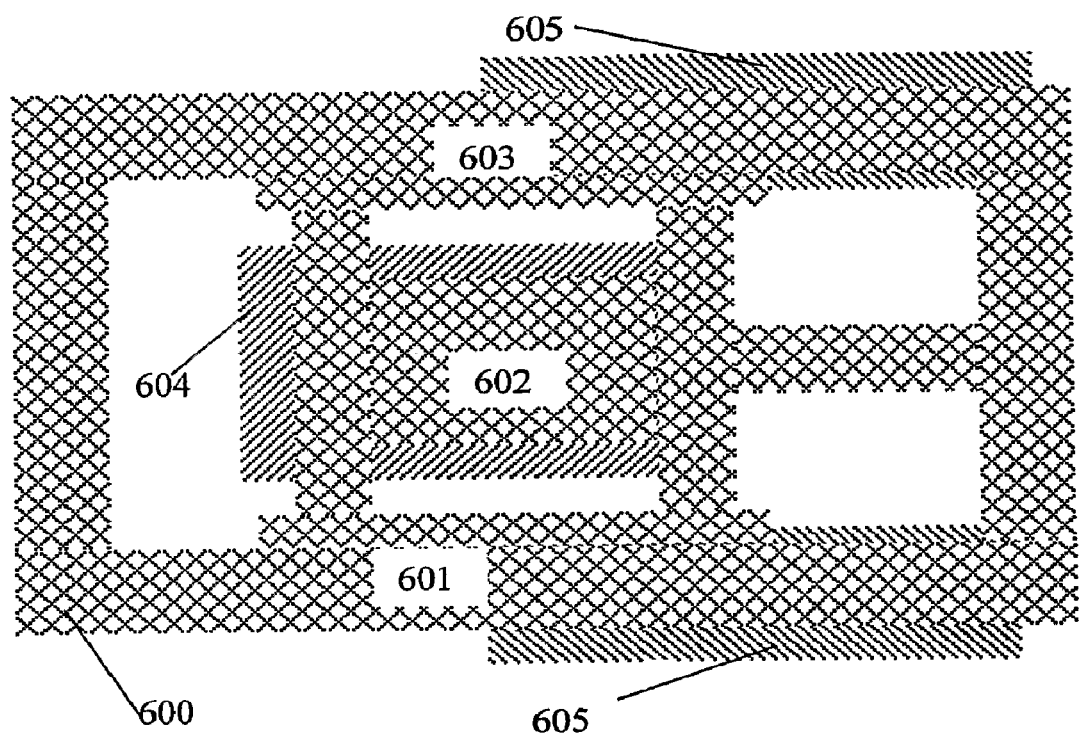
FIG. 6 shows the micromechanical element comprising one or more parallel beam segments.

One of the primary objectives of the present inventions is to augment the elastic strain energy stored in the micromechanical element to enhance the speed of release thereof from the contact electrode. Referring to FIG. 6, in yet a further embodiment of the present invention, the micromechanical element 600 may comprise one or more parallel beam segments, for example, segment 601, segment 602 and segment 603. The element 600 is responsive to electrodes 604 and 604 arranged laterally to each other. In use, as the structure undergoes the metastable state as described hereinbefore, that is, the structure is pulled down under the influence of electrodes 604 and 605 and warps further prior to release resulting in increased bending stiffness along the length.

With segment 602 arranged in this way, the twisted side beams have increased bending stiffness. In addition, the arrangement of the present embodiment minimizes the pull down effect while the torsional moment is maximized on the side beams. Consequently more elastic strain energy can be induced into the system corresponding to the same amount of vertical deflection than in case of the micromechanical element of the present invention.

Although a particular embodiment is described herein for a micromechanical memory element and method of use therefore, it is not intended that such specific references be considered as limitations upon the scope of this invention. Furthermore, having described the invention in connection with certain specific embodiments thereof, it is to be understood that further modifications may now suggest themselves to those skilled in the art, it is intended to cover all such modifications as falling within the scope of the appended claims.

The invention claimed is:

1. A method for controlling a nonvolatile switch, comprising:
applying a first biasing voltage to a switching electrode;
moving a micromechanical element from a first state spaced from a contact electrode to a second state in contact with the contact electrode and spaced a first distance from the switching electrode; and
applying an electrical pulse to the switching electrode to move the micromechanical element to the first state, the electrical pulse falling at a rate that is faster than the mechanical resonance of the micromechanical element.

2. The method of claim 1, wherein the first state is a stable state and the second state is a stable state.

3. The method of claim 2, wherein applying the electrical pulse increases the elastic energy stored in the micromechanical element.

4. The method of claim 3, wherein prior to applying the electrical pulse, the adhesive energy between the contact electrode and the micromechanical element is greater than the restoration force of the micromechanical element.

5. The method of claim 1, wherein the micromechanical element has a first portion having a first bending stiffness and a second portion having a second bending stiffness that is greater than the first bending stiffness.

6. The method of claim 1, further comprising charge transferring from the micromechanical element to the contact electrode to program the micromechanical element.

7. The method of claim 6, further comprising deprogramming the micromechanical element.

8. The method of claim 7, further comprising moving the micromechanical element to a location spaced a second distance from the switching electrode, wherein the micromechanical element remains in contact with the contact electrode while the micromechanical element moves to a location spaced a second distance from the switching electrode.

9. A method for controlling a nonvolatile micro-electromechanical system, comprising:
applying a first biasing voltage to a switching electrode;
moving a micromechanical element from a first state spaced from a contact electrode to a second state in contact with the contact electrode such that adhesive energy at the interface between the micromechanical element and the contact electrode is generated;
increasing the elastic energy of the micromechanical element to a value greater than the adhesive energy at the interface between the micromechanical element and the contact electrode; and
moving the micromechanical element to the first state.

10. The method of claim 9, wherein the micromechanical element is coated with polymer.

11. The method of claim 10, wherein the contact electrode is coated with polymer.

12. The method of claim 9, further comprising charge transferring from the micromechanical element to the contact electrode to program the micromechanical element.

13. The method of claim 9, wherein the micromechanical element remains spaced from the switching electrode when the elastic energy of the micromechanical element increases.

14. The method of claim 9, further comprising removing the first biasing voltage before increasing the elastic energy of the micromechanical element.

15. The method of claim 9, applying a voltage to the micromechanical element while the micromechanical element moves to the first state.

16. The method of claim 9, wherein the micromechanical element remains in contact with the contact electrode while increasing the elastic energy of the micromechanical element.

17. A method for controlling a bi-stable micro-electromechanical system, comprising:
applying a first electrical signal to a switching electrode to move a micromechanical element from a first stable state spaced from a contact electrode to a second stable state in contact with the contact electrode;
removing the first electrical signal applied to the switching electrode;
applying a second electrical signal to the switching electrode to move the micromechanical element from the second stable state, wherein the second electrical signal is an electrical pulse that falls at a rate that is faster than the mechanical resonance of the micromechanical element; and then
moving the micromechanical element to the first stable state.

18. The method of claim 17, wherein applying the second electrical signal increases the elastic energy stored in the micromechanical element.

19. The method of claim 17, wherein the micromechanical element remains in contact with the contact electrode when the micromechanical element is moved from the second stable state.

20. The method of claim 17, wherein applying the second electrical signal increases the elastic energy stored in the micromechanical element to a value that is greater than the adhesive forces present at the interface between the micromechanical element and the contact electrode.

* * * * *